(12) United States Patent
Nakagawa et al.

(10) Patent No.: US 9,139,771 B2
(45) Date of Patent: Sep. 22, 2015

(54) COPPER OXIDE ETCHANT AND ETCHING METHOD USING THE SAME

(71) Applicant: ASAHI KASEI E-MATERIALS CORPORATION, Tokyo (JP)

(72) Inventors: Norikiyo Nakagawa, Tokyo (JP); Takuto Nakata, Tokyo (JP); Yoshimichi Mitamura, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 105 days.

(21) Appl. No.: 14/098,109

(22) Filed: Dec. 5, 2013

(65) Prior Publication Data

US 2014/0091058 A1    Apr. 3, 2014

Related U.S. Application Data

(62) Division of application No. 13/579,490, filed as application No. PCT/JP2011/050549 on Jan. 14, 2011.

(30) Foreign Application Priority Data

| Feb. 25, 2010 | (JP) | 2010-039693 |
| Feb. 25, 2010 | (JP) | 2010-040122 |
| Jul. 7, 2010 | (JP) | 2010-154855 |
| Dec. 17, 2010 | (JP) | 2010-282267 |

(51) Int. Cl.
| C03C 25/68 | (2006.01) |
| C09K 13/00 | (2006.01) |
| H01L 21/033 | (2006.01) |
| H01L 21/3213 | (2006.01) |
| B82Y 40/00 | (2011.01) |

(52) U.S. Cl.
CPC ............ *C09K 13/00* (2013.01); *H01L 21/0337* (2013.01); *H01L 21/32134* (2013.01); *B82Y 40/00* (2013.01)

(58) Field of Classification Search
None
See application file for complete search history.

(56) References Cited

U.S. PATENT DOCUMENTS

| 6,429,105 B1 | 8/2002 | Kunikiyo |
| 7,060,631 B2 * | 6/2006 | Morgan ........................ 438/745 |
| 7,951,653 B1 * | 5/2011 | Park et al. .................... 438/132 |

(Continued)

FOREIGN PATENT DOCUMENTS

| CN | 101228481 B | 12/2012 |
| EP | 2 246 170 A1 | 11/2010 |

(Continued)

OTHER PUBLICATIONS

Japanese Office Action dated Dec. 3, 2013 for Japanese Application No. 2012-501699.

(Continued)

*Primary Examiner* — Binh X Tran
*Assistant Examiner* — David Cathey, Jr.
(74) *Attorney, Agent, or Firm* — Birch, Stewart, Kolasch & Birch, LLP (57) ABSTRACT

In order to provide a copper oxide etchant and an etching method using the same capable of selectively etching exposure/non-exposure portions when laser light exposure is performed by using copper oxide as a thermal-reactive resist material, the copper oxide etchant for selectively etching copper oxides having different oxidation numbers in a copper oxide-containing layer containing the copper oxide as a main component contains at least a chelating agent or salts thereof.

7 Claims, 7 Drawing Sheets

(56) References Cited

U.S. PATENT DOCUMENTS

| | | |
|---|---|---|
| 2002/0119656 A1* | 8/2002 | Smith et al. .................... 438/687 |
| 2002/0134963 A1* | 9/2002 | Peyne et al. .................... 252/79.1 |
| 2003/0159362 A1* | 8/2003 | Singh et al. .................... 51/293 |
| 2003/0211814 A1 | 11/2003 | Shih et al. |
| 2004/0020135 A1 | 2/2004 | Tsuchiya et al. |
| 2005/0136193 A1 | 6/2005 | Weidman et al. |
| 2006/0157854 A1 | 7/2006 | Takewaki et al. |
| 2006/0199749 A1 | 9/2006 | Suzuki et al. |
| 2009/0283497 A1 | 11/2009 | Kondo |
| 2009/0301996 A1 | 12/2009 | Visintin et al. |

FOREIGN PATENT DOCUMENTS

| | | |
|---|---|---|
| EP | 2 439 050 A1 | 4/2012 |
| JP | 9-18143 A | 1/1997 |
| JP | 2001-262374 A | 9/2001 |
| JP | 2005-105333 A | 4/2005 |
| JP | 2005-105410 A | 4/2005 |
| JP | 2007-509235 A | 4/2007 |
| JP | 2007-144995 A | 6/2007 |
| JP | 4055543 B2 | 12/2007 |
| JP | 2008-88541 A | 4/2008 |
| JP | 2008-143162 A | 6/2008 |
| JP | 2008-168610 A | 7/2008 |
| JP | 2008-532289 A | 8/2008 |
| JP | 2009-277905 A | 11/2009 |
| JP | 2011-144377 A | 7/2011 |
| WO | WO 2006/093770 A1 | 9/2006 |
| WO | WO 2009/093700 A1 | 7/2009 |
| WO | WO 2010/140648 A1 | 12/2010 |

OTHER PUBLICATIONS

Taiwan Office Office Action mailed Dec. 3, 2013 for Taiwanese Application No. 100101531.

Chavez et al., "A novel method of etching copper oxide using acetic acid", Journal of the Electrochemical Society Electrochem. Soc. USA, vol. 148, No. 11, Nov. 2001, pp. G640-G643.

European Search Report dated Apr. 8, 2013 for EP11747093.0.

European Search Report dated Jun. 3, 2013 for Application No. 11 747 093.0.

International Search Report issued in PCT/JP2011/050549, dated Mar. 22, 2011.

* cited by examiner

COPPER OXIDE ETCHANT AND ETCHING METHOD USING THE SAME

This application is a Divisional of application Ser. No. 13/579,490 filed on Oct. 9, 2012, which is the U.S. National Phase of PCT/JP2011/050549, filed Jan. 14, 2011, and which claims priority to Application Nos. 2010-039693, 2010-040122, 2010-154855 and 2010-282267 filed in Japan, on Feb. 25, 2010, Feb. 25, 2010, Jul. 7, 2010 and Dec. 17, 2010, respectively. The entire contents of all of the above applications is hereby incorporated by reference.

TECHNICAL FIELD

This disclosure relates to a copper oxide etchant and an etching method used in an etching process in a micropatterning technology in which copper oxide is used as a thermal-reactive resist material.

BACKGROUND

In recent years, as demands for a high density and a high integration increase in the fields of semiconductors, optical/magnetic recordings, and the like, a micropatterning technology capable of patterning a size of several tens to several hundreds nanometers or smaller becomes indispensable. In this regard, a lot of researches have been made for elemental techniques in each process such as masks/steppers, exposure, and resist materials in order to implement such a micropatterning.

Although many studies have been made for resist materials, the resist material most widely used at this time is a photo-reactive organic resist (hereinafter, also referred to as a "photoresist") that reacts to an exposure light source such as infrared light, an electron ray, and an X-ray (e.g., refer to Patent Literature 1 and Non-Patent Literature 1).

Figure 1:
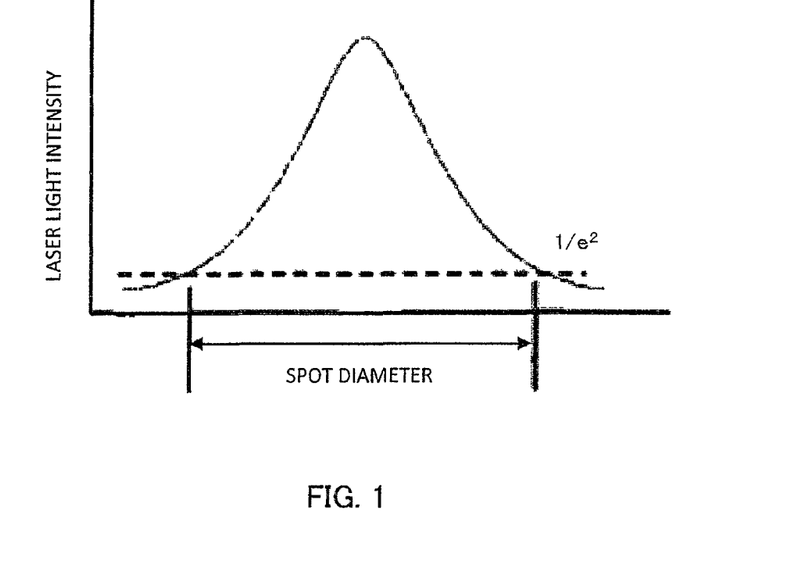
FIG. 1 is a diagram illustrating an intensity distribution of laser light.

In the laser light used in exposure, the laser light intensity typically adjusted using a lens has a Gaussian distribution as illustrated in FIG. 1, where a spot diameter is defined as $1/e^2$. In general, reaction of the photoresist is initiated when energy expressed as $E=h\nu$ (where E denotes energy, h denotes a Frank's constant, and $\nu$ denotes a wavelength) is absorbed. Therefore, since the reaction does not strongly depend on the light intensity, but depends on the wavelength of light, almost the entire portion where light is irradiated generates reaction (light irradiation portion≈exposure portion). For this reason, when the photoresist is used, reliable exposure would be achieved for the spot diameter.

The technique of using the photoreactive organic resist is very effective to forma fine pattern having a size of several hundreds nanometers. However, it is necessary to perform exposure with a spot diameter smaller than that of the pattern required in principle in order to use the photoreactive photoresist and form the fine pattern. Therefore, it is necessary to use KrF laser or ArF laser having a short wavelength as the exposure light source. However, such a light source unit is large-sized and expensive, and thus, it is not suitable in terms of reduction of the manufacturing cost. In addition, when an exposure light source such as an electron ray or an X-ray is used, it is necessary to provide an exposure atmosphere in a vacuum state. Therefore, a vacuum chamber is employed. This gives a considerable limitation in terms of the cost or the large size.

Figure 2:
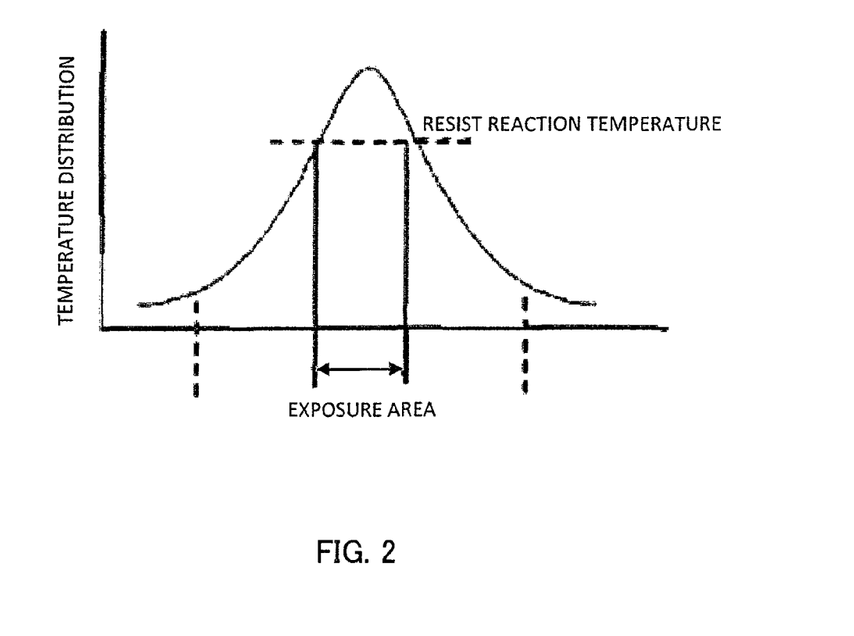
FIG. 2 is a diagram illustrating a temperature distribution on the portion where laser light is irradiated.

Meanwhile, if laser light having an intensity distribution illustrated in FIG. 1 is irradiated onto an object, a temperature of the object also exhibits a Gaussian distribution similar to the intensity distribution of the laser light. In this case, if a resist that reacts at a certain temperature or higher, i.e., a thermal-reactive resist is used, the reaction is processed in only the portion heated up to a predetermined temperature or higher as illustrated in FIG. 2. Therefore, it is possible to exposure a range smaller than the spot diameter (light irradiation portion≠exposure portion). That is, it is possible to form a fine pattern having a size smaller than the spot diameter without shortening the wavelength of the exposure light source. Therefore, it is possible to alleviate influence of the wavelength of the exposure light source by using the thermal-reactive resist.

Until now, techniques have been reported for forming a fine pattern through exposure or thermal/optical reaction caused by semiconductor laser and the like by using WOx, MoOx, noble metal oxides, and the like as a thermal-reactive resist (e.g., refer to Patent Literatures 2 to 4 and Non-Patent Literature 2). WOx and MoOx are known as a resist material called imperfect oxide having a degree of oxidation X smaller than that of perfect oxide. The degree of oxidation X is changed by heating through exposure, and a difference of solubility for the etchant is generated due to a difference of the degree of oxidation, so that a fine pattern can be formed through etching. For this reason, the etching characteristic is changed by a slight difference of the degree of oxidation X, so that a very high technique is necessary to manufacture a resist having excellent reproducibility based on a lot of parameters such as a condition of the start material, a method of forming a film, and an exposure method. In addition, tungsten (W) or molibdenum (Mo) problematically has a low resistance to a dry etching using a fluorine-based gas.

Meanwhile, noble metal oxide may be used to form the fine pattern by generating decomposition of noble metal oxide through thermal reaction, optical reaction, and the like and performing etching based on a difference of solubility for the etchant generated between decomposed and undecomposed portions. This technique is characterized in that a resist having excellent reproducibility can be obtained without significantly being influenced from a condition of the start material (for example, a slight difference of the degree of oxidation) because the material is decomposed at a certain temperature (decomposition temperature) in the case of, for example, thermal reaction. However, although the noble metal oxide used as the decomposed material in Patent Literatures 3 and 4 allows for pattern formation by generating decomposition reaction such as thermal reaction, optical reaction, and the like, a material particle growth is also generated along with the decomposition. Therefore, this technique takes only a sea-island structure in which a resist portion remaining after the etching is at random, and it is difficult to control a pattern size in a uniform convex-concavo or line-shaped fine pattern and the like.

The copper oxide as noble metal oxide generates abrupt decomposition to discharge oxygen when it reaches a decomposition temperature, and its particle growth is suppressed in comparison with the noble metal oxide used in Patent Literatures 3 and 4. Therefore, the copper oxide is an effective resist material for forming a fine pattern. However, although there are a number of etchants for copper as disclosed in Patent Literatures 5 to 8, there has not been reported for the selective etching of exposure/non-exposure portions with high precision when exposure is performed using noble metal oxide, particularly, copper oxide.

CITATION LIST

Patent Literatures

[Patent Literature 1] Japanese Patent Application Laid-open No. 2007-144995

[Patent Literature 2] Japanese Patent No. 4055543
[Patent Literature 3] Japanese Patent Application Laid-open No. 2008-143162
[Patent Literature 4] Japanese Patent Application Laid-open No. 2008-168610
[Patent Literature 5] Japanese Patent Application Laid-open No. 2005-105410
[Patent Literature 6] Japanese Patent Application Laid-open No. 2005-105333
[Patent Literature 7] Japanese Patent Application Laid-open No. 2001-262374
[Patent Literature 8] Japanese Patent Application Laid-open No. 2008-088541

Non-Patent Literatures

[Non-patent Literature 1] "Advanced Resist Material," pages 59 to 76, published by JOHOKIKO Co. Ltd., in Tokyo, Japan
[Non-patent Literature 2] The 19th Symposium on Phase Change Optical Information Storage, 2007, preceding, pages 77 to 80

SUMMARY OF INVENTION

Technical Problem

A need thus exists for a copper oxide etchant and an etching method using the same capable of selectively etching exposure portions and non-exposure portions when laser light exposure is performed by using copper oxide as a thermal-reactive resist material.

Solution to Problem

The inventors made diligent studies and experiments for addressing the problems described above. As a result, the inventors found out a fact that the selective etching of exposure/non-exposure portions can be achieved when exposure is performed by using copper oxide as a thermal-reactive resist material in a solution containing at least a chelating agent and complete the disclosure based on this fact. That is, the disclosure is as follows.

According to an aspect of the disclosure, there is provided a copper oxide etchant for selectively etching copper oxides having different oxidation numbers in a copper oxide-containing layer containing copper oxide as a main component, wherein the copper oxide etchant contains at least a chelating agent or a salt thereof.

In the copper oxide etchant of the disclosure, it is preferable that the chelating agent contain at least one element selected from a group consisting of amino acids such as alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine, valine, and proline, or other chelating agents such as oxalic acid, ethylenediaminetetraacetic acid, hydroxyethylethylenediaminetriacetic acid, dihydroxyethylethylenediaminediacetic acid, 1,3-propanediaminetertaacetic acid, citric acid, fumaric acid, adipic acid, succinic acid, malic acid, tartaric acid, and bathocuproinesulfonic acid, or salts thereof.

In the copper oxide etchant of the disclosure, it is preferable that the chelating agent contain at least one of the amino acids.

In the copper oxide etchant of the disclosure, it is preferable that the amino acid contain at least one element selected from a group consisting of alanine, glycine, lysine, or ornithine.

In the copper oxide etchant of the disclosure, it is preferable that a ratio of the chelating agent in the copper oxide etchant is equal to or greater than 0.00001 mass % and equal to or smaller than 10 mass %.

According to another aspect of the disclosure, there is provided an etching method using the copper oxide etchant described above, the etching method including: a thermal decomposition process for thermally decomposing copper oxide in a predetermined area of a copper oxide-containing layer containing copper oxide; and an etching process for supplying the copper oxide etchant to the copper oxide-containing layer to remove copper oxide in a predetermined area thermally decomposed from the copper oxide-containing layer.

In the etching method of the disclosure, in the etching process, a liquid discharge pressure when the copper oxide etchant is applied is equal to or greater than 0.005 MPa and equal to or smaller than 0.15 MPa.

Technical Advantages of the Invention

According to this disclosure, it is possible to provide a copper oxide etchant and an etching method using the same capable of selectively etching exposure/non-exposure portions when laser light exposure is performed by using copper oxide as a thermal-reactive resist material.

DESCRIPTION OF EMBODIMENTS

The inventors made diligent efforts to achieve a micropatterning technology capable of forming a fine pattern with a high aspect ratio. Since the entire organic resist material in the exposure portion is reacted when an organic resist material is used to form the fine pattern, the micropatterning precision is limited by the wavelength of laser light. Meanwhile, in a thermal-reactive resist material thermally reacted by heating, only the region where a temperature reaches a certain temperature (decomposition temperature) is thermally reacted. For this reason, if the thermal-reactive resist material is used to form the fine pattern, it is possible to form the fine pattern having a wavelength equal to or shorter than that of laser light.

The inventors focused on copper oxides as the thermal-reactive resist material. As the copper oxides, there are known copper oxide (II) and copper oxide (I). If the copper oxide (II) is heated to a certain temperature or higher, oxygen is discharged, and copper oxide (II) is reduced to copper oxide (I). Since the thermal decomposition reaction from copper oxide (II) to copper oxide (I) is processed abruptly, it is possible to selectively perform thermal decomposition from copper oxide (II) to copper oxide (I) in a desired area of the thermal-reactive resist material by appropriately controlling a heating temperature. For this reason, it is possible to form a fine pattern with a high aspect ratio by using a copper oxide etchant for selectively dissolving the copper oxide (I) in the thermal-reactive resist material subjected to the thermal decomposition.

The inventors made diligent studies for the copper oxide etchant selectively reacted with the copper oxide (I). As a result, the inventors found out a fact that copper oxide (I) can be selectively dissolved from a resist material in which copper oxides having different oxidation numbers are mixedly contained after thermal decomposition, and a fine pattern can be formed with a high aspect ratio if a copper oxide etchant containing a predetermined chelating agent or salts thereof is used. Finally, the inventors achieve the present disclosure based on this fact.

Hereinafter, embodiments of the disclosure will be described with reference to the accompanying drawings.

An etching target of the copper oxide etchant disclosed herein is copper oxide. For example, the copper oxide etchant is used for selectively etching the exposure/non-exposure portions when laser light exposure is performed by using a copper oxide-containing layer containing the copper oxide as a main component as a thermal-reactive resist material.

The copper oxide etchant disclosed herein contains at least a chelating agent and is, particularly, a solution obtained by mixing water. In the copper oxide used as the thermal-reactive resist material, oxygen is discharged, and decomposition is generated when a decomposition temperature is reached by the heat caused by laser light exposure, so that copper oxide having a different structure and a different composition with a lower degree of oxidation, compared to those before the exposure is performed, is obtained. If a copper oxide etchant containing at least the chelating agent is reacted with such copper oxide having at least two types of oxidation states with a different structure and a different composition obtained by the exposure, it is possible to selectively dissolve the copper oxide in the exposure portion, by reacting the chelating agent with the copper oxide after the exposure. In this disclosure, the chelating agent refers to an organic acid having a plurality of carboxyl groups or amino groups in the same molecule and capable of being coordinated with copper in at least two or more functional groups.

Although the structure and the composition of copper oxide are changed by the laser light exposure by way of example herein, any method may be employed without limiting to laser light irradiation if it can decompose copper oxide by heating a predetermined area in the copper oxide-containing layer to a predetermined temperature or higher. In addition, "containing copper oxide as a main component" means that a composition of the copper oxide-containing layer includes copper oxide of 50 mass %, preferably, 70 mass % or higher, more preferably, 80 mass % or higher, and, most preferably, 90 mass % or higher. However, the upper limit is set to 100 mass % or lower. If the ratio of copper oxide is lower than 50 mass %, the decomposition reaction of copper oxide is not uniformly processed, so that it is difficult to achieve the selective etching.

Specifically, the chelating agent used in this disclosure may include amino acids such as alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine, valine, and proline, or chelating agents other than the amino acids such as oxalic acid, ethylenediaminetetraacetic acid, hydroxyethylethylenediaminetriacetic acid, dihydroxyethylethylenediaminediacetic acid, 1,3-propanediaminetertaacetic acid, diethylenetriaminepentaacetic acid, triethylenetetraaminehexaacetic acid, 1,2-diaminopropane tetraacetic acid, ethylenediaminedisuccinic acid, dihydroxyethylethylenediaminemonosuccinic acid, 1,3-propanediamine disuccinic acid, triethylenetetraminetrisuccinic acid, 1,2-diaminopropane disuccinic acid, ethylenediaminetetrapropionic acid, hydroxyethylethylenediaminetripropionic acid, dihydroxyethylethylenediaminedipropionic acid, 1,3-propanediamine tetrapropionic acid, diethylenetriaminepentapropionic acid, triethylenetetraminehexapropionic acid, 1,2-diaminopropane tetraacetic acid, citric acid, isocitric acid, fumaric acid, adipic acid, succinic acid, glutamic acid, malic acid, tartaric acid, and bathocuproinedisulfonic acid. In addition, the chelating agent used in this disclosure may include salts such as lithium salts, sodium salts, potassium salts, ammonium salts, calcium salts, magnesium salts, polyalkyl ammonium salts, polyaryl ammonium salts, or hydrochloride salts thereof. As the salts of the chelating agent, if a plurality of carboxylic acids, sulfonic acids, and the like are contained, overall carboxylic acids and sulfonic acids may be salts, or a part of carboxylic acids and sulfonic acids may be salts.

The chelating agent and the salt thereof disclosed herein contain at least one of the aforementioned chelating agents and salts thereof. Out of such chelating agents, in terms of availability and water solubility, the chelating agent preferably includes alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine, valine, or proline. In addition, the chelating agent preferably includes oxalic acid, ethylenediaminetetraacetic acid, hydroxyethylethylenediaminetriacetic acid, dihydroxyethylethylenediaminediacetic acid, 1,3-propanediaminetertaacetic acid, citric acid, fumaric acid, adipic acid, succinic acid, malic acid, tartaric acid, bathocuproinesulfonic acid, or salts thereof. More preferably, the chelating agent includes glycine, alanine, histidine, isoleucine, leucine, lysine, methionine, ornithine, phenylalanine, serine, threonine, tryptophan, tyrosine, valine, ethylenediaminetetraacetic acid, hydroxyethylethylenediaminetriacetic acid, citric acid, bathocuproinedisulfonic acid, or salts thereof. Particularly, the chelating agent preferably includes glycine, alanine, ornithine, lysine, or salts thereof.

If such a chelating agent is contained, activation energy necessary in complexation between the chelating agent and the copper oxide having a degree of oxidation changed by exposure is lower than activation energy necessary in complexation between the chelating agent and the copper oxide before exposure. Therefore, the complexation reaction between the chelating agent and the copper oxide having a degree of oxidation changed by exposure is rapidly processed. In addition, since the stability of the complexation product of the copper oxide after exposure is higher than that of the copper oxide before exposure, it is possible to selectively dissolve the copper oxide in the exposure portion.

Since the chelating agent contains at least one of the amino acids, formation of chelate with the copper oxide having a degree of oxidation changed by exposure is more rapidly processed. In addition, since the stability of the complexation product of the copper oxide after exposure is also higher than that of the copper oxide before exposure, it is possible to more selectively dissolve the copper oxide in the exposure portion.

If the chelating agent contains at least one of amino acids selected from a group consisting of glycine, alanine, ornithine, or lysine, water solubility is particularly high. Therefore, a concentration controllable range is wide, and formation of chelate with the copper oxide having a degree of oxidation changed by exposure is more rapidly processed. Furthermore, since the stability of the complexation product is high as the copper oxide after exposure is stable, it is possible to particularly selectively dissolve the copper oxide in the exposure portion.

Some of the aforementioned chelating agent may be used as a copper etchant. However, even when some of the aforementioned chelating agent may be used as a copper etchant in general, they may not be used as a selective etchant for a mixture of the copper oxides having different oxidation numbers. For example, although the etchant containing a copper ammine complex and the like may be used as a copper etchant, it is difficult to sufficiently obtain a difference of the complexation constant caused by the valence using such an etchant. Therefore, it is difficult to selectively etch a mixture of copper oxides having different oxidation numbers.

In the copper oxide etchant disclosed herein, other components such as acid or alkali, an oxidizing agent, and a surfactant may be added with an arbitrary concentration if it does not hinder a chelating reaction between the copper oxide and the chelating agent.

As the oxidizing agent, any typical oxidizing agent may be used without a particular limitation. Specifically, the oxidizing agent may include, for example, hydrogen peroxide, sodium permanganate, potassium permanganate, ammonium permanganate, calcium permanganate, magnesium permanganate, silver permanganate, barium permanganate, lithium chlorate, sodium chlorate, potassium chlorate, ammonium chlorate, lithium bromate, sodium bromate, potassium bromate, ammonium bromate, lithium iodate, sodium iodate, potassium iodate, ammonium iodate, perchloric acid, lithium perchlorate, sodium perchlorate, potassium perchlorate, ammonium perchlorate, calcium perchlorate, silver perchlorate, perbromic acid, lithium perbromate, sodium perbromate, potassium perbromate, ammonium perbromate, calcium perbromate, silver perbromate, periodic acid, lithium periodate, sodium periodate, potassium periodate, ammonium periodate, calcium periodate, silver periodate, dichromic acid, lithium dichromate, sodium dichromate, potassium dichromate, calcium dichromate, magnesium dichromate, osmium tetroxide, meta-chloroperoxybenzoic acid, lithium persulfate, sodium persulfate, potassium persulfate, ammonium persulfate, or iron chloride. Out of these oxidizing agents, in terms of availability, safety, and environmental burdens, the oxidizing agent preferably includes hydrogen peroxide, potassium permanganate, lithium persulfate, sodium persulfate, potassium persulfate, ammonium persulfate, or iron chloride. Most preferably, the oxidizing agent includes hydrogen peroxide, sodium persulfate, potassium persulfate, ammonium persulfate, or iron chloride.

Any surfactant may be used as the aforementioned surfactant without a particular limitation if wettability or permeability is improved. A surfactant commercially available in the market may be directly used or may be synthesized. The surfactant may include an anionic system, a cationic system, a nonionic system, or an amphoterism. Out of them, preferably, the surfactant includes the anionic system, the nonionic system, or the amphoterism. More preferably, the surfactant includes the anionic system or the nonionic system. Such a surfactant may be solely used, or two or more types of surfactants may be mixedly used.

The anionic system surfactant may include a carboxylic acid type, a sulfonic acid type, a sulfuric acid ester type, and a phosphoric acid ester type. In addition, the nonionic system surfactant may include a polyethylene glycole type, a polyalkylene glycol type, a polyhydric alcohol type, and an acetylene type. Specifically, the anionic system surfactant may include olefin sulfonic acid, alkyl sulfonic acid, benzene sulfonic acid, alkyl sulfonic acidester, alkyl ether sulfateester, alkylcarboxylic acid, perfluoroalkyl sulfonic acid, monoalkyl phosphoric acid, salts thereof, and the like. Out of them, lithium monododecyl phosphate, sodium monododecyl phosphate, or potassium monododecyl phosphate is preferably used. The nonionic system surfactant may include poly(oxyethylene)alkyl ether, poly(oxyethylene) fatty acid ester, polyethylene glycole, polyoxyethylenepolyoxypropylene ether, glycerine fatty acid ester, acetylene diol, acetylene glycol, and the like. Out of them, poly(oxyethylene)alkyl ether, poly(oxyethylene) fatty acid ester, acetylene diol, or the like is preferably used.

If the copper oxide etchant has high foamability, etching irregularity is easily generated due to the foam. Therefore, a surfactant having low foamability may be used, or a surfactant having a defoaming action may be simultaneously added.

In the copper oxide etchant disclosed herein, the etch rate can be controlled by adjusting a concentration of the chelating agent. That is, if the concentration of the chelating agent increases, the etch rate increases. On the contrary, if the concentration of the chelating agent decreases, the etch rate decreases. The concentration may increase If the rate is too low to give reasonable efficiency, and may be appropriately selected based on a thickness of the resist, desired regularity or efficiency, or the like. From the viewpoint described above, the concentration of the chelating agent for the entire copper oxide etchant is preferably set to be equal to or greater than 0.00001 mass % and be equal to or smaller than 10 mass %, more preferably, equal to or greater than 0.00001 mass % and equal to or smaller than 1 mass %, and most preferably, equal to or greater than 0.01 mass % and equal to or smaller than 1 mass %. In addition, for the amino acids, the concentration of the chelating agent is preferably set to be equal to or greater than 0.01 mass % and equal to or smaller than 10 mass %, more preferably, equal to or greater than 0.1 mass % and equal to or smaller than 10 mass %, and most preferably, equal to or greater than 0.1 mass % and equal to or smaller than 3 mass %.

The oxidizing agent disclosed herein is used to adjust an electric potential of the etchant. If the concentration of the oxidizing agent is too low, it is difficult to process the etching. If the concentration of the oxidizing agent is too high, the etching selectivity may be degraded. From the viewpoint described above, the concentration of the oxidizing agent for the entire etchant is preferably set to be equal to or greater than 0.01 mass % and equal to or smaller than 1 mass %, and more preferably, equal to or greater than 0.1 mass % and equal to or smaller than 1 mass %.

The surfactant disclosed herein is used to improve wettability and permeability of the etchant. If the amount of the surfactant is extremely small, the effect is poor. On the contrary, if the concentration of the surfactant is too high, foaming is significantly generated, and this causes etching irregularity and the like. From the viewpoint described above, the concentration of the surfactant for the entire etchant is preferably set to be equal to or greater than 0.00001 mass % and equal to or smaller than 1 mass %, more preferably, equal to or greater than 0.0001 mass % and equal to or smaller than 0.1 mass %, and most preferably, equal to or greater than 0.01 mass % and equal to or smaller than 0.1 mass %.

The pH value of the copper oxide etchant disclosed herein is mostly set to be equal to or greater than 1 and equal to or smaller than 11 depending on the type of the chelating agent. However, the pH value may be changed within this range by adding any acid or alkali without degrading the effects. Unfortunately, a desired effect may not be obtained if any acid or alkali that promotes or inhibits complexation or that generates oxidation or reduction to remarkably change an electric potential. Furthermore, a desired effect may not be obtained if the pH value is significantly deviated from the pH range set to be equal to or greater than 1 and equal to or smaller than 11, so that the etching is processed in a different mechanism. The acid or the alkali that preferably satisfies the aforementioned condition may include hydrochloric acid, sulfuric acid, nitric acid, ammonia, potassium hydroxide, sodium hydroxide, or tetramethylammonium hydroxide. More preferably, the acid or the alkali includes hydrochloric acid, sulfuric acid, ammonia, or tetramethylammonium hydroxide.

How to react the copper oxide etchant with the resist is not particularly limited. The resist may be immersed into the copper oxide etchant, or the etchant may be sprayed to the resist. When the resist is immersed into the copper oxide etchant, the etch rate can increase by increasing the amount of the etchant corresponding to the resist per unit time by circulating the etchant or operating the resist. In addition, when the copper oxide etchant is sprayed to the resist, the etch rate can increase by increasing the liquid discharge pressure. However, if the discharge pressure is too high, the selectivity and the regularity of etching may be degraded. In addition, if the discharge pressure is too low, the sprayed etchant is not applied regularly, so that the regularity of etching may be degraded. In this regard, the discharge pressure is preferably set to be equal to or greater than 0.005 MPa and equal to or smaller than 0.15 MPa, more preferably, equal to or greater than 0.01 MPa and equal to or smaller than 0.10 MPa, and most preferably, equal to or greater than 0.01 MPa and equal to or smaller than 0.05 MPa. When the copper oxide etchant is sprayed to the resist, the nozzle may move, or the resist may rotate, and the like. Preferably, such a method may be employed solely or in combination to process the etching regularly. Any type of the nozzle may be used in spraying. For example, the nozzle may be a line slit, a full cone nozzle, a hollow cone nozzle, a flat nozzle, a uniform flat nozzle, a solid nozzle, and the like. The nozzle may be selected depending on a shape of the resist or the base material. Naturally, a plurality of nozzles may be arranged side by side, and either single-fluid nozzle or two-fluid nozzle may be used.

The etch rate can be changed by controlling the temperature when the copper oxide etchant is applied to the resist. Any temperature may be set if it does not freeze or boil the copper oxide etchant, volatilize the copper oxide etchant at a rate where the concentration abruptly changes, or decompose the resist or a component of the copper oxide etchant. For the reason described above, the temperature range is preferably set to be equal to or higher than 0° C. and equal to or lower than 80° C., more preferably, equal to or higher than 10° C. and equal to or lower than 60° C., even more preferably, equal to or higher than 10° C. and equal to or lower than 40° C., and most preferably, equal to or higher than 20° C. and equal to or lower than 40° C.

If there is an impurity such as insoluble fine powder in the copper oxide etchant when the copper oxide etchant is applied to the resist, it may cause irregularity in etching of the fine pattern. Therefore, the copper oxide etchant is preferably filtered in advance. Any material may be selected for the filter used in the filtering if it does not react with the copper oxide etchant. For example, PFA, PTFE, and the like may be used. The roughness of the filter may be selected based on a pattern precision, and is generally set to be equal to or smaller than 0.2 µm, and more preferably, equal to or smaller than 0.1 µm. In addition, in order to prevent eduction or re-deposition of the eluted component, spraying is more preferable than immersion. In addition, when the copper oxide etchant is sprayed to the resist, the etchant is preferably disposable. When the copper oxide etchant is reutilized, the eluted component is preferably removed.

A base material of the resist where the copper oxide etchant disclosed herein is applied is not particularly limited by a material or a shape. However, the material of the resist preferably has excellent surface flatness and processability. Such a material may include glass, silicon, silicon dioxide, aluminum, titanium, copper, silver, gold, and the like. Particularly, the material preferably includes glass, silicon, silicon dioxide, aluminum, titanium, or copper. In addition, the shape of the resist may be two-dimensional such as a flat plate or three-dimensional such as a roll.

Next, description will be made for an etching method using the copper oxide etchant described above. The etching method disclosed herein includes a thermal decomposition process for thermally decomposing copper oxide in a predetermined area of the copper oxide-containing layer which contains copper oxide and an etching process for supplying the copper oxide-containing layer with the copper oxide etchant and removing a predetermined area of the thermally decomposed copper oxide from the copper oxide-containing layer.

In the thermal decomposition process, the copper oxide in a predetermined area of the copper oxide layer is thermally decomposed by adding heat of a predetermined temperature or higher to a predetermined area of the copper oxide-containing layer. In addition, in the thermal decomposition process, the thermal decomposition in the copper oxide-containing layer is preferably performed by irradiating laser light onto the copper oxide-containing layer. Since the temperature of a predetermined area of the copper oxide-containing layer has a Gaussian distribution (refer to FIG. 2) by irradiating laser light onto a predetermined area of the copper oxide layer, reaction is generated in only the portion of a predetermined temperature or higher, and it is possible to thermally decompose a range smaller than the spot diameter of the laser light. In addition, the thermal decomposition may be performed without limiting to laser light if the copper oxide can be decomposed by adding heat of a predetermined temperature or higher to a predetermined area of the copper oxide-containing layer.

In the etching process, the copper oxide etchant is supplied to the copper oxide-containing layer to remove copper oxide in a predetermined area of the copper oxide-containing layer by resolution. In the copper oxide-containing layer after the thermal decomposition process, there are copper oxide that is not thermally decomposed and copper oxide having a reduced oxidation number due to the thermal decomposition.

Since the chelating agent in the copper oxide etchant is selectively reacted with the copper oxide having a reduced oxidation number due to the thermal decomposition, it is possible to selectively remove copper oxide in the copper oxide area thermally decomposed from the copper oxide-containing layer by resolution.

The etching method disclosed herein preferably includes a process of cleaning the etching layer (copper oxide-containing layer) and a process of cleaning the base material and the etching layer after the etching.

EXAMPLES

Figure 3:
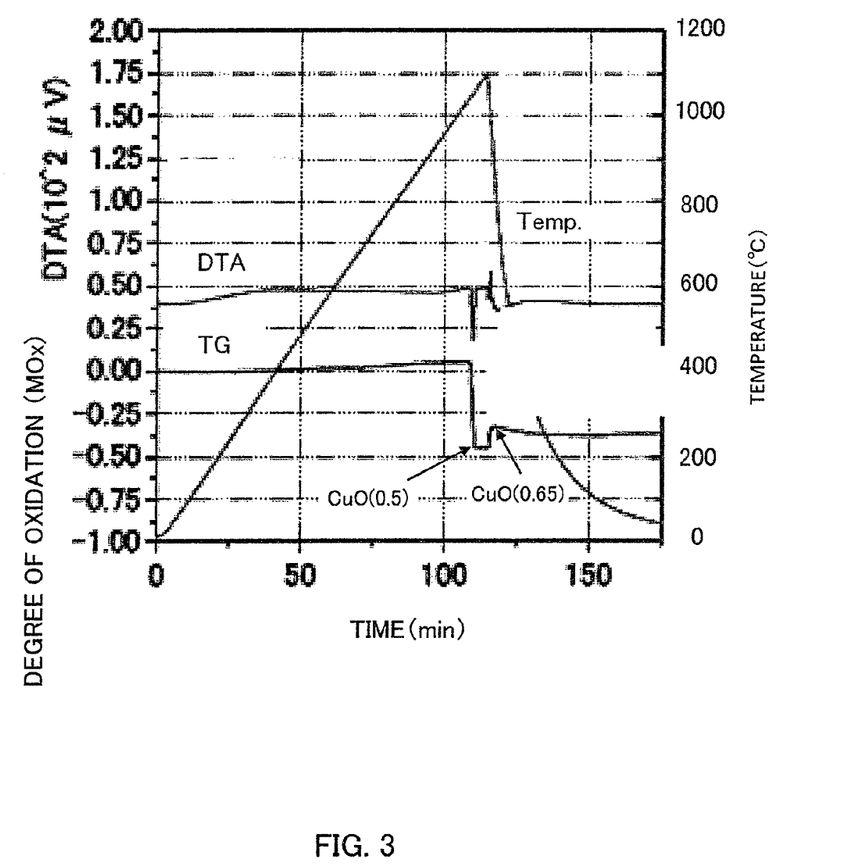
FIG. 3 is a diagram illustrating a thermogravimetric measurement result of copper oxide (II)

Hereinafter, description will be made for examples performed to make the effects of the disclosure apparent, but they are not intended to limit this disclosure.
Oxidation Number of Copper Oxide FIG. 3 illustrates a result of thermogravimetric measurement of copper oxide (II). If the thermogravimetric measurement is performed for powder of copper oxide (II), an endothermic reaction is recognized by reduction of copper oxide (II) at a temperature of 1050° C. (refer to DTA of FIG. 3), and decrease of the weight caused by discharge of oxygen accordingly generated is observed (refer to TG of FIG. 3). Estimating from the decrease rate of the weight, it is recognized that the valence of copper oxide decreases from 2 (before heating) to nearly 1 (after heating). As a result, it is recognized that copper oxide (II) is reduced by heating, and the oxidation number decreases, so that copper oxide containing copper oxide (I) as a main component is generated. However, in FIG. 3, the valence decreases to 1 (copper oxide (I), CuO 0.5), and then, re-oxidation is generated, so that the valence becomes 1.5 (CuO 0.65). Nonetheless, it is estimated that most of them have a state of copper oxide (I) from the result of X-ray diffraction described below.

Figure 4:
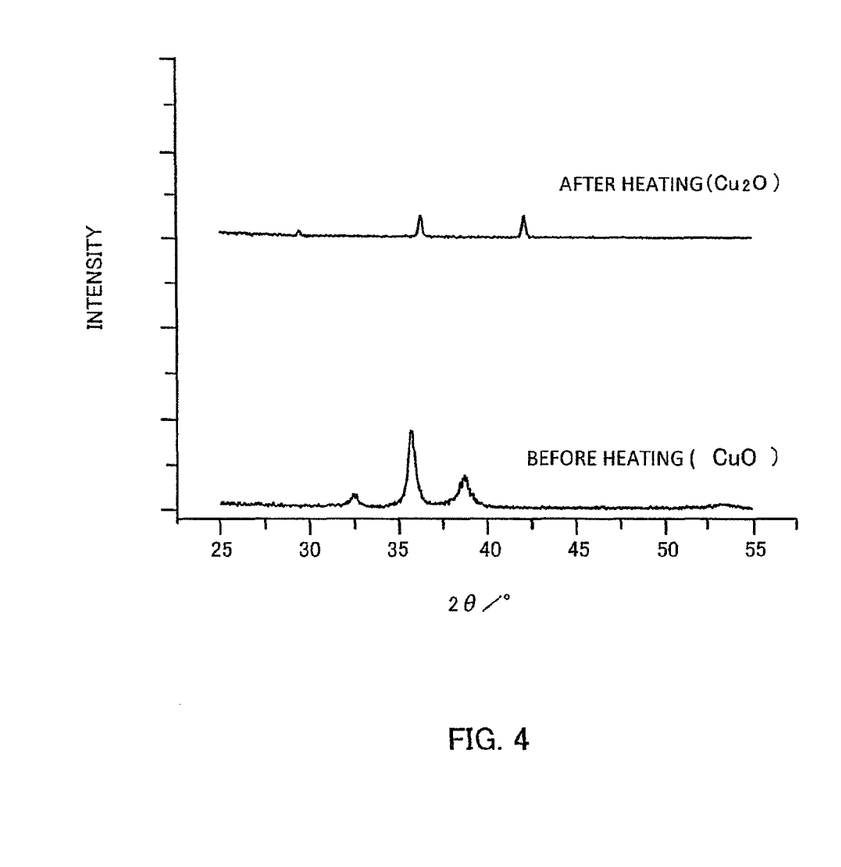
FIG. 4 is a diagram illustrating an X-ray diffraction measurement result for copper oxide (I) and copper oxide (II)

FIG. 4 illustrates a result of X-ray diffraction measurement for copper oxide (I) and copper oxide (II). If the X-ray diffraction is measured before and after heating the powder of copper oxide (II), a peak belonging to copper oxide (II) is observed at the room temperature. On the contrary, if it is heated to 1000° C., the peak belonging to copper oxide (II) is lost, and only the peak belonging to copper oxide (I) is observed (FIG. 4). As a result, it is recognized that the valence of copper oxide (II) decreases by heating so that copper oxide (II) changes to copper oxide (I).
Dissolution Selectivity of Copper Oxide Hereinafter, description will be made for a result of review that solubility is changed by the valence of copper oxide when the copper oxide etchant disclosed herein is used. The number of moles of copper dissolved when copper oxide (II) powder and copper oxide (I) powder are input to a glycine aqueous solution of 30 g of 3 mass %, and they are agitated for thirty minutes at a temperature of 23° C. was obtained. As a result, copper oxide (I) is dissolved by 0.43 mmol as an equivalent of copper, and copper oxide (II) is only dissolved by 0.10 mmol as an equivalent of copper. Therefore, using the copper oxide etchant disclosed herein, it is possible to selectively dissolve one of the copper oxides when copper oxides having different valences are mixedly provided.

Example 1

A film of copper oxide was formed on a glass flat substrate of 50 mmϕ using a sputtering method under the following condition.
target: copper oxide (II) (3 inchesϕ)
power (W): RF100
gas type: mixed gas of argon and oxygen (ratio 95:5)
pressure (Pa): 0.5
film thickness (nm): 20

This copper oxide film was exposed under the following condition.
exposure semiconductor laser wavelength: 405 nm
lens numerical aperture: 0.85
exposure laser power: 1 mW to 10 mW
feeding pitch: 260 nm Although it is possible to manufacture various shapes or patterns by modulating the laser light intensity during exposure, a successive trench shape was used as a pattern in the experiment in order to facilitate evaluation of an interface after the etching. The formed shape may be an isolated circular shape, an elliptical shape, or the like depending on the target use, and the exposure shape is not intended to limit the disclosure.

As an index for indicating only the exposure or non-exposure portions of the copper oxide film are selectively dissolved, if a ratio of the trench depth after the etching against the original film thickness is between 0.6 and 1, that is, in this example, the trench depth is 12 nm to 20 nm against a film thickness of 20 nm, it can be said that the etching is selectively processed. In addition, it can be said that particularly excellent selectivity is obtained if a ratio of the trench depth after the etching against the original film thickness is between 0.8 and 1. In addition, it can be said that significantly excellent selectivity is obtained if the ratio is between 0.9 and 1.

Figure 5:
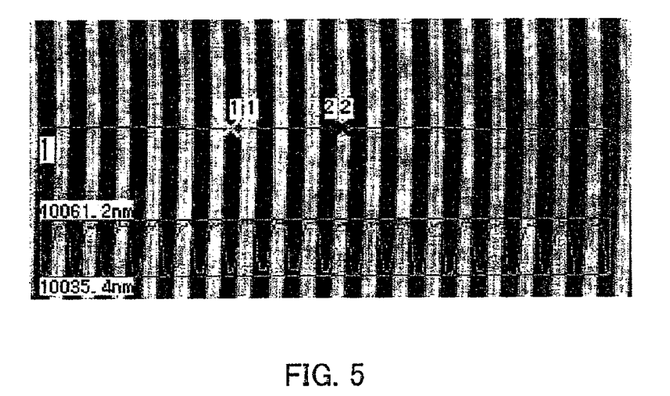
FIG. 5 is a photograph obtained by taking an atomic force microscope (AFM) image of the copper oxide film subjected to the etching of Example 1 disclosed herein.

Next, a copper oxide sample exposed under the aforementioned condition was etched using the copper oxide etchant prepared under the following condition. The pH value of the etchant was 6.5, and the concentration of the chelating agent in the etchant was 3 mass %.
glycine: 0.9 g
water: 30 g The etching was performed by immersing the copper oxide in the copper oxide etchant for 16 minutes at a temperature of 23° C. Then, an atomic force microscope (AFM) image of the etched copper oxide film was measured. In the AFM measurement, an atomic force microscope (VN-8000, manufactured by KEYENCE Corporation) was used. As a result, a periodic trench shape having a trench depth of 20.0 nm was observed (FIG. 5). For a pitch of 260 nm, the trench width was 88 nm. From this example, it is recognized that only the copper oxide of which the structure/composition is changed by thermal reaction through exposure is selectively etched, and the copper oxide not subjected to the exposure is not etched.

Example 2

Figure 6:
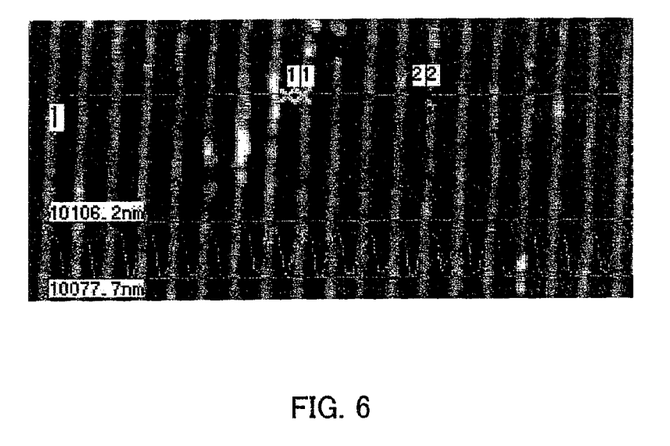
FIG. 6 is a photograph obtained by taking an AFM image of the copper oxide film subjected to the etching of Example 2 disclosed herein.

The copper oxide film formed and exposed under the same condition as that of Example 1 was etched using the copper oxide etchant prepared under the following condition. The pH value of the etchant was 6.4. The concentration of the chelating agent in the etchant was 3 mass %.
alanine: 0.9 g
water: 30 g The etching was performed by immersing the copper oxide in the copper oxide etchant for 30 minutes at a temperature of 23° C. Then, the AFM image of the etched copper oxide film was measured (FIG. 6). As a result, the periodic trench shape having a trench depth of 20.0 nm was observed. For a pitch of 260 nm, the trench width was 80 nm.

Example 3

Figure 7:
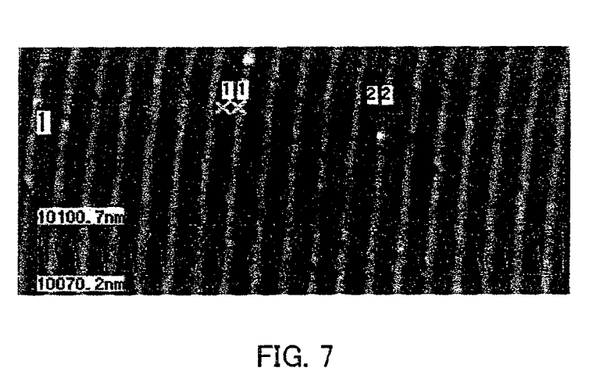
FIG. 7 is a photograph obtained by taking an AFM image of the copper oxide film subjected to the etching of Example 3 disclosed herein.

The copper oxide film formed and exposed under the same condition as that of Example 1 was etched using the copper oxide etchant prepared under the following condition. The pH value of the etchant was 3.7. The concentration of the chelating agent in the etchant was 3 mass %.
ornithine hydrochloride: 0.9 g
water: 30 g The etching was performed by immersing the copper oxide in the copper oxide etchant for 30 minutes at a temperature of 23° C. Then, the AFM image of the etched copper oxide film was measured (FIG. 7). As a result, the periodic trench shape having a trench depth of 20.0 nm was observed. For a pitch of 260 nm, the trench width was 85 nm.

Example 4

Figure 8:
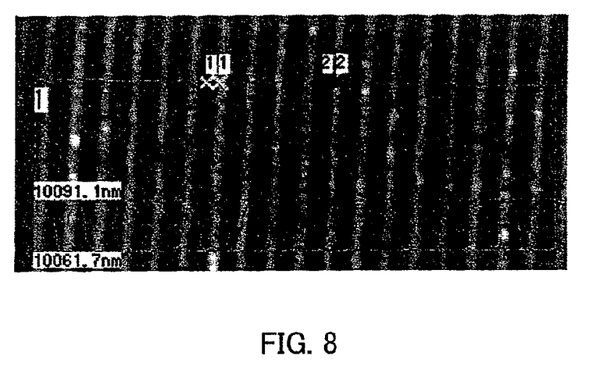
FIG. 8 is a photograph obtained by taking an AFM image of the copper oxide film subjected to the etching of Example 4 disclosed herein.

The copper oxide film formed and exposed under the same condition as that of Example 1 was etched using the copper oxide etchant prepared under the following condition. The pH value of the etchant was 6.7. The concentration of the chelating agent in the etchant was 3 mass %.
lysine: 0.9 g
water: 30 g The etching was performed by immersing the copper oxide in the copper oxide etchant for 30 minutes at a temperature of 23° C. Then, the AFM image of the etched copper oxide film was measured (FIG. 8). As a result, the periodic trench shape having a trench depth of 20.0 nm was observed. For a pitch of 260 nm, the trench width was 89 nm.

Example 5

Figure 9:
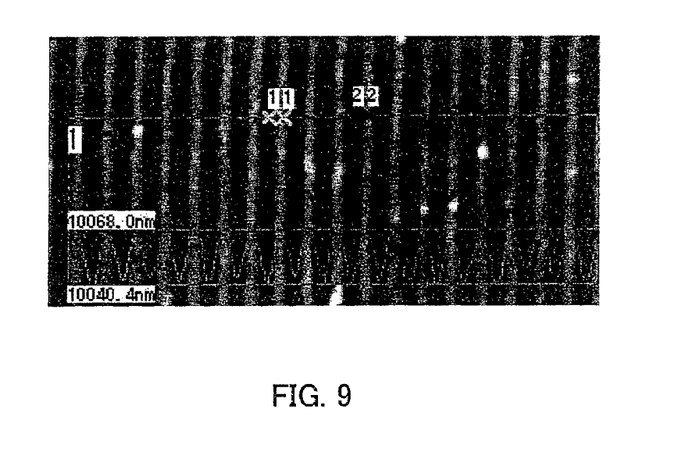
FIG. 9 is a photograph obtained by taking an AFM image of the copper oxide film subjected to the etching of Example 5 disclosed herein.

The copper oxide film formed and exposed under the same condition as that of Example 1 was etched using the copper oxide etchant prepared under the following condition. The pH value of the etchant was 6.5. The concentration of the chelating agent in the etchant was 3 mass %.
proline: 0.9 g
water: 30 g The etching was performed by immersing the copper oxide in the copper oxide etchant for 30 minutes at a temperature of 23° C. Then, the AFM image of the etched copper oxide film was measured (FIG. 9). As a result, the periodic trench shape having a trench depth of 20.0 nm was observed. For a pitch of 260 nm, the trench width was 82 nm.

Example 6

The copper oxide film formed and exposed under the same condition as that of Example 1 was etched using the copper oxide etchant prepared under the same condition as that of Example 1. The etching was performed by spraying the copper oxide etchant to the copper oxide using a line slit nozzle for 15 minutes at a temperature of 23° C. Then, the AFM image of the etched copper oxide film was measured. As a result, the periodic trench shape having a trench depth of 20.0 nm was observed. For a pitch of 260 nm, the trench width was 98 nm.

Example 7

The copper oxide film formed under the same condition as that of Example 1 was exposed under the following condition.
exposure semiconductor laser wavelength: 405 nm
lens numerical aperture: 0.85
exposure laser power: 1 to 10 mW
feeding pitch: 240 nm.

Figure 10:
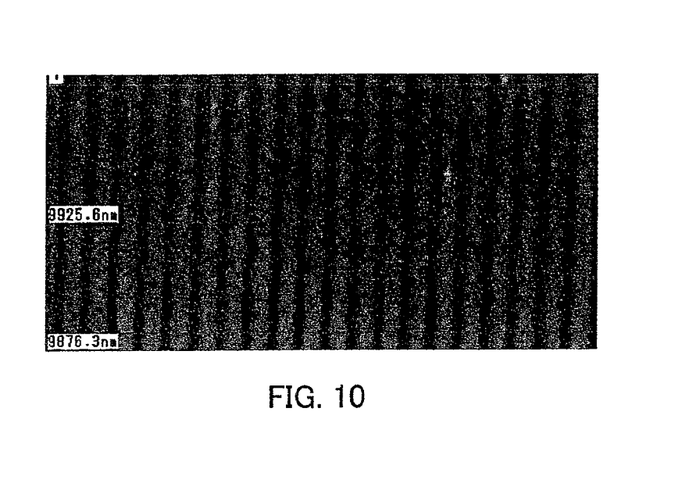
FIG. 10 is a photograph obtained by taking an AFM image of the copper oxide film subjected to the etching of Example 7 disclosed herein.

Then, the copper oxide sample exposed under the aforementioned condition was etched using the etchant prepared under the following condition. The pH value of the etchant was 6.5. The concentration of the chelating agent in the etchant was 3 mass %.
glycine: 0.9 g
water: 30 g The etching was performed by immersing the copper oxide in the copper oxide etchant for 16 minutes at a temperature of 23° C. Then, an atomic force microscope (AFM) image of the etched copper oxide film was measured. As a result, a periodic trench shape having a trench depth of 19.6 nm was observed (FIG. 10). For a pitch of 240 nm, the trench width was 88 nm. From this example, it is recognized that only the copper oxide of which the structure/composition is changed by thermal reaction through exposure is selectively etched, and the copper oxide not subjected to the exposure is not etched.

Example 8

The copper oxide film formed and exposed under the same condition as that of Example 7 was etched using the copper oxide etchant prepared under the following condition. The pH value of the etchant was 6.4. The concentration of the chelating agent in the etchant was 1 mass %.
alanine: 0.3 g
water: 30 g The etching was performed by immersing the copper oxide in the copper oxide etchant for 30 minutes at a temperature of 23° C. Then, the AFM image of the etched copper oxide film was measured. As a result, a periodic trench shape having a trench depth of 19.8 nm was observed. For a pitch of 260 nm, the trench width was 107 nm.

Example 9

The copper oxide film formed and exposed under the same condition as that of Example 7 was etched using the etchant prepared under the following condition. The pH value of the etchant was 6.2. The concentration of the chelating agent in the etchant was 0.5 mass %.
methionine: 0.15 g
water: 30 g The etching was performed by immersing the copper oxide in the copper oxide etchant for 60 minutes at a temperature of 23° C. Then, the AFM image of the etched copper oxide film was measured. As a result, a periodic trench shape having a trench depth of 20.0 nm was observed. For a pitch of 240 nm, the trench width was 109 nm.

Example 10

The copper oxide film formed and exposed under the same condition as that of Example 7 was etched using the copper oxide etchant prepared under the following condition. The pH value of the etchant was 6.7. The concentration of the chelating agent in the etchant was 0.5 mass %.
lysine: 0.15 g
water: 30 g The etching was performed by immersing the copper oxide in the copper oxide etchant for 90 minutes at a temperature of 23° C. Then, the AFM image of the etched copper oxide film was measured. As a result, a periodic trench shape having a trench depth of 19.9 nm was observed. For a pitch of 240 nm, the trench width was 115 nm.

Example 11

The copper oxide film formed and exposed under the same condition as that of Example 7 was etched using the copper oxide etchant prepared under the same condition as that of Example 7. The etching was performed by spraying the etchant to the copper oxide using a line slit nozzle for 15 minutes at a temperature of 23° C. Then, the AFM image of the etched copper oxide film was measured. As a result, a periodic trench shape having a trench depth of 20.0 nm was observed. For a pitch of 240 nm, the trench width was 98 nm.

Example 12

The copper oxide formed and exposed under the same condition as that of Example 1 was etched using the copper oxide etchant prepared under the following condition. In addition, Adekatol SO-135 is a nonionic surfactant manufactured by ADEKA Corporation. The pH value of the etchant was 4.6. The concentration of the chelating agent in the etchant was 0.6 mass %.
ethylenediaminetetraacetic acid disodium salt: 1.7 g
30% hydrogen peroxide solution: 1.9 g
Adekatol SO-135: 0.30 g
water: 300 g
The etching was performed by immersing the copper oxide in the copper oxide etchant for 8 minutes at a temperature of 23° C. Then, the AFM image of the etched copper oxide film was measured. As a result, a periodic trench shape having a trench depth of 16.5 nm was observed. For a pitch of 260 nm, the trench width was 100 nm.

Example 13

The copper oxide film formed and exposed under the same condition as that of Example 1 was etched using the copper oxide etchant prepared under the following condition. The pH value of the etchant was 7.5. The concentration of the chelating agent in the etchant was 0.5 mass %.
citric acid trisodium salt: 1.4 g
30% hydrogen peroxide solution: 1.9 g
Adekatol SO-135: 0.40 g
water: 300 g
The etching was performed by immersing the copper oxide in the copper oxide etchant for 30 minutes at a temperature of 23° C. Then, the AFM image of the etched copper oxide film was measured. As a result, a periodic trench shape having a trench depth of 20.0 nm was observed. For a pitch of 260 nm, the trench width was 82 nm.

Example 14

The copper oxide film formed and exposed under the same condition as that of Example 1 was etched using the copper oxide etchant prepared under the following condition. The pH value of the etchant was 6.0. The concentration of the chelating agent in the etchant was 0.3 mass %.
glycine: 1.6 g
30% hydrogen peroxide solution: 1.9 g
Adekatol SO-135: 0.40 g
Water: 300 g
The etching was performed by immersing the copper oxide in the copper oxide etchant for 16 minutes at a temperature of 23° C. Then, the AFM image of the etched copper oxide was measured. As a result, a periodic trench shape having a trench depth of 20.0 nm was observed. For a pitch of 260 nm, the trench width was 100 nm.

Example 15

The copper oxide film formed and exposed under the same condition as that of Example 1 was etched using the copper oxide etchant prepared under the following condition. The pH value of the etchant was 4.6. The concentration of the chelating agent in the etchant was 0.5 mass %.
citric acid trisodium salt: 1.4 g
30% hydrogen peroxide solution: 1.9 g
Adekatol SO-135: 0.40 g
water: 300 g
hydrochloric acid: added until the pH value becomes 4.6.
The etching was performed by immersing the copper oxide in the copper oxide etchant for 30 minutes at a temperature of 23° C. Then, the AFM image of the etched copper oxide was measured. As a result, a periodic trench shape having a trench depth of 20.0 nm was observed. For a pitch of 260 nm, the trench width was 92 nm.

Example 16

The copper oxide film formed and exposed under the same condition as that of Example 1 was etched using the copper oxide etchant prepared under the following condition. The pH value of the etchant was 5.3. The concentration of the chelating agent in the etchant was 0.006 mass %.
ethylenediaminetetraacetic acid disodium salt: 0.017 g
30% hydrogen peroxide solution: 1.9 g
Adekatol SO-135: 0.40 g
water: 300 g
The etching was performed by immersing the copper oxide in the copper oxide etchant for 90 minutes at a temperature of 23° C. Then, the AFM image of the etched copper oxide was measured. As a result, a periodic trench shape having a trench depth of 15.2 nm was observed. For a pitch of 260 nm, the trench width was 110 nm.

Example 17

The copper oxide film formed and exposed under the same condition as that of Example 1 was etched using the copper oxide etchant prepared under the following condition. The pH value of the etchant was 4.0. The concentration of the chelating agent in the etchant was 5 mass %.
ethylenediaminetetraacetic acid disodium salt: 17 g
30% hydrogen peroxide solution: 1.9 g
Adekatol SO-135: 0.40 g
water: 300 g
The etching was performed by immersing the copper oxide in the copper oxide etchant for 10 minutes at a temperature of 23° C. Then, the AFM image of the etched copper oxide was measured. As a result, a periodic trench shape having a trench depth of 13.2 nm was observed. For a pitch of 260 nm, the trench width was 155 nm.

Example 18

The copper oxide film formed and exposed under the same condition as that of Example 1 was etched using the copper oxide etchant prepared under the following condition. The pH value of the etchant was 4.5. The concentration of the chelating agent in the etchant was 0.6 mass %.
ethylenediaminetetraacetic acid disodium salt: 1.7 g
30% hydrogen peroxide solution: 0.10 g
Adekatol SO-135: 0.40 g
water: 300 g
The etching was performed by immersing the copper oxide in the copper oxide etchant for 60 minutes at a temperature of 23° C. Then, the AFM image of the etched copper oxide was measured. As a result, a periodic trench shape having a trench depth of 18.5 nm was observed. For a pitch of 260 nm, the trench width was 97 nm.

Example 19

The copper oxide film formed and exposed under the same condition as that of Example 1 was etched using the copper oxide etchant prepared under the following condition. The pH value of the etchant was 4.6. The concentration of the chelating agent in the etchant was 0.6 mass %.
ethylenediaminetetraacetic acid disodium salt: 1.7 g
30% hydrogen peroxide solution: 1.9 g
Adekatol SO-135: 0.0010 g
water: 300 g The etching was performed by immersing the copper oxide in the copper oxide etchant for 60 minutes at a temperature of 23° C. Then, the AFM image of the etched copper oxide was measured. As a result, a periodic trench shape having a trench depth of 16.0 nm was observed. For a pitch of 260 nm, the trench width was 80 nm.

Example 20

Figure 11:
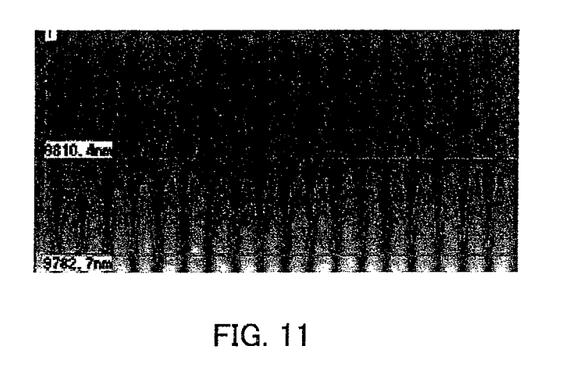
FIG. 11 is a photograph obtained by taking an AFM image of the copper oxide film subjected to the etching of Example 20 disclosed herein.

The copper oxide film formed and exposed under the same condition as that of Example 1 was etched using the copper oxide etchant prepared under the following condition. The pH value of the etchant was 2.5. The concentration of the chelating agent in the etchant was 0.5 mass %.
citric acid: 1.4 g
30% hydrogen peroxide solution: 1.9 g
Adekatol SO-135: 0.40 g
water: 300 g The etching was performed by immersing the copper oxide in the copper oxide etchant for 8 minutes at a temperature of 23° C. Then, the AFM image of the etched copper oxide was measured (FIG. 11). As a result, a periodic trench shape having a trench depth of 20.0 nm was observed. For a pitch of 260 nm, the trench width was 85 nm.

Example 21

A film was formed and exposed under the same condition as that of Example 1, and a mixture of the copper oxides having different valences was etched using the etchant prepared under the same condition as that of Example 1. The etching was performed by spraying the etchant to the copper oxide using a line slit nozzle for 10 minutes at a temperature of 23° C. with a discharge pressure of 0.03 MPa. Then, the AFM image of the etched copper oxide was measured. As a result, a periodic trench shape having a trench depth of 14.2 nm was observed. For a pitch of 260 nm, the trench width was 142 nm.

Example 22

A film of copper oxide was formed on an aluminum roll substrate having a length of 100 mm and 120 mmφ using a sputtering method under the following condition.
target: copper oxide (II) (3 inchesφ)
power (W): RF100
gas type: mixed gas of argon and oxygen (ratio 9:1)
pressure (Pa): 0.5
film thickness (nm): 20

This copper oxide film was exposed under the following condition.
exposure semiconductor laser wavelength: 405 nm
lens numerical aperture: 0.85
exposure laser power: 1 mW to 10 mW
feeding pitch: 260 nm Then, exposure was performed, and a mixture of the copper oxides having different valences was etched using the etchant prepared under the same condition as that of Example 1. The etching was performed by spraying the etchant to a mixture of the copper oxides having different valences using a line slit nozzle for 10 minutes at a temperature of 23° C. with a discharge pressure of 0.02 MPa. Then, the AFM image of the etched copper oxide was measured. As a result, a periodic trench shape having a trench depth of 14.8 nm was observed. For a pitch of 260 nm, the trench width was 135 nm.

Example 23

Figure 12:
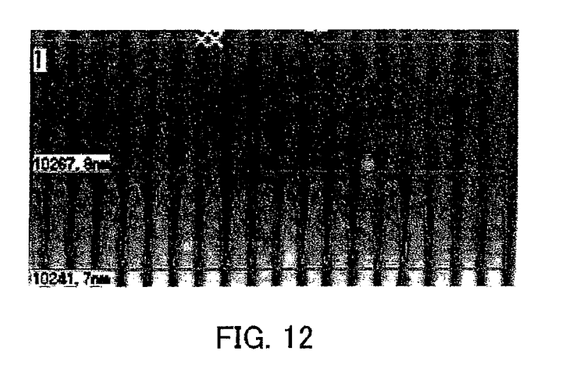
FIG. 12 is a photograph obtained by taking an AFM image of the copper oxide film subjected to the etching of Example 23 disclosed herein.

The copper oxide film formed and exposed under the same condition as that of Example 1 was etched using the copper oxide etchant prepared under the following condition. The pH value of the etchant was 1.7. The concentration of the chelating agent in the etchant was 0.3 mass %.
oxalic acid: 0.9 g
30% hydrogen peroxide solution: 1.9 g
Adekatol SO-35: 0.40 g
water: 300 g The etching was performed by immersing the copper oxide in the copper oxide etchant for one minute at a temperature of 23° C. Then, the AFM image of the etched copper oxide film was measured (FIG. 12). As a result, a periodic trench shape having a trench depth of 20.0 nm was observed. For a pitch of 260 nm, the trench width was 100 nm.

Example 24

The copper oxide film formed and exposed under the same condition as that of Example 1 was etched using the copper oxide etchant prepared under the following condition. The pH value of the etchant was 4.6. The concentration of the chelating agent in the etchant was 0.3 mass %.
sodium oxalic acid: 1.0 g
30% hydrogen peroxide solution: 1.9 g
Adekatol SO-135: 0.40 g
water: 300 g The etching was performed by immersing the copper oxide in the copper oxide etchant for 4 minutes at a temperature of 23° C. Then, the AFM image of the etched copper oxide was measured. As a result, a periodic trench shape having a trench depth of 20.0 nm was observed. For a pitch of 260 nm, the trench width was 82 nm.

Example 25

The copper oxide film formed and exposed under the same condition as that of Example 1 was etched using the copper oxide etchant prepared under the following condition. The pH value of the etchant was 4.6. The concentration of the chelating agent in the etchant was 0.3 mass %.
oxalic acid: 0.9 g
30% hydrogen peroxide solution: 1.9 g
Adekatol SO-135: 0.40 g
water: 300 g
10% sodium hydroxide solution: added until the pH value becomes 4.6

The etching was performed by immersing the copper oxide in the copper oxide etchant for 4 minutes at a temperature of 23° C. Then, the AFM image of the etched copper oxide was measured. As a result, a periodic trench shape having a trench depth of 19.0 nm was observed. For a pitch of 260 nm, the trench width was 98 nm.

Example 26

The copper oxide film formed and exposed under the same condition as that of Example 1 was etched using the copper oxide etchant prepared under the same condition as that of Example 16. The etching was performed by spraying the etchant to the copper oxide using a line slit nozzle for 0.5 minutes at a temperature of 23° C. with a discharge pressure of 0.03 MPa. Then, the AFM image of the etched copper oxide was measured. As a result, a periodic trench shape having a trench depth of 18.2 nm was observed. For a pitch of 260 nm, the trench width was 97 nm.

Example 27

A film of copper oxide was formed on an aluminum roll substrate having a length of 100 mm and 120 mmϕ using a sputtering method under the following condition.
target: copper oxide (II) (3 inchesϕ)
power (W): RF100
gas type: mixed gas of argon and oxygen (ratio 9:1)
pressure (Pa): 0.5
film thickness (nm): 20
This copper oxide film was exposed under the following condition.
exposure semiconductor laser wavelength: 405 nm
lens numerical aperture: 0.85
exposure laser power: 1 mW to 10 mW
feeding pitch: 260 nm
Then, the copper oxide was etched using the copper oxide etchant prepared under the same condition as that of Example 16. The etching was performed by spraying the etchant to a mixture of the copper oxides having different valences using a line slit nozzle for 0.5 minutes at a temperature of 23° C. with a discharge pressure of 0.02 MPa. Then, the AFM image of the etched copper oxide was measured. As a result, a periodic trench shape having a trench depth of 19.6 nm was observed. For a pitch of 260 nm, the trench width was 96 nm.

Comparative Example 1

The copper oxide film formed and exposed under the same condition as that of Example 1 was etched using the copper oxide etchant prepared under the following condition.
sulfuric acid-copper pentahydrate: 6.6 g
water: 300 g
ammonia water: added until the pH value becomes 9
The etching was performed by immersing the copper oxide film in the etchant for 60 minutes at a temperature of 23° C., and the AFM image was measured. However, the trench shape was not observed. In this etchant, it is not possible to selectively etch only one of a mixture of the copper oxides having different oxidation numbers.

Comparative Example 2

The copper oxide film formed and exposed under the same condition as that of Example 1 was etched using the copper oxide etchant prepared under the following condition. The pH value of the etchant was 6.0. The concentration of the chelating agent in the etchant was 0.0000003 mass %.
ethylenediaminetetraacetic acid disodium salt: 0.001 g
30% hydrogen peroxide solution: 1900 g
Adekatol SO-135: 400 g
water: 300 kg
The etching was performed by immersing the copper oxide film in the etchant for 120 minutes at a temperature of 23° C., and the AFM image was measured. However, the trench shape was not observed. In this etchant, it is not possible to selectively etch only one of a mixture of the copper oxides having different oxidation numbers.

Comparative Example 3

The copper oxide film formed and exposed under the same condition as that of Example 1 was etched using the copper oxide etchant prepared under the following condition. The pH value of the etchant was 4.4. The concentration of the chelating agent in the etchant was 0.5 mass %.
ethylenediaminetetraacetic acid disodium salt: 1.7 g
30% hydrogen peroxide solution: 19 g
Adekatol SO-135: 0.40 g
water: 300 g
The etching was performed by immersing the copper oxide film in the etchant for 5 minutes at a temperature of 23° C., and as a result, the entire copper oxide film was lost. The AFM image was measured, but the trench shape was not observed. In this etchant, it is not possible to selectively etch only one of a mixture of the copper oxides having different oxidation numbers.

Comparative Example 4

The copper oxide film formed and exposed under the same condition as that of Example 1 was etched using the etchant prepared under the same condition as that of Example 12.
The etching was performed by spraying the etchant to a mixture of the copper oxides having different valences using a line slit nozzle for 2 minutes at a temperature of 23° C. with a discharge pressure of 0.3 MPa. Then, the AFM image of the etched copper oxide was measured. As a result, while a periodic trench shape having a trench depth of 5.8 nm was observed in a certain place, no trench shape was found in other places, so that the etching selectivity or homogeneity was degraded resultantly.

Comparative Example 5

A film was formed under the same condition as that of Example 1, exposure was performed, and a mixture of the copper oxides having different valences was etched using the etchant prepared under the following condition. The pH value of the etchant was 5.0. The concentration of the chelating agent in the etchant was 0.0000003 mass %.
oxalic acid: 0.00001 g
30% hydrogen peroxide solution: 19 g
Adekatol SO-135: 4.0 g
water: 3000 g
The etching was performed by immersing the copper oxide film in the etchant for 120 minutes at a temperature of 23° C., and the AFM image was measured. However, the trench shape was not observed. In this etchant, it is not possible to selectively etch only one of a mixture of the copper oxides having different oxidation numbers.

Comparative Example 6

A film was formed under the same condition as that of Example 1, exposure was performed, and a mixture of the copper oxides having different valences was etched using the etchant prepared under the following condition. The pH value of the etchant was 1.6. The concentration of the chelating agent in the etchant was 0.3 mass %.

oxalic acid: 0.9 g
30% hydrogen peroxide solution: 19 g
Adekatol SO-135: 0.40 g
water: 300 g The etching was performed by immersing the copper oxide film in the etchant for one minute at a temperature of 23° C., and as a result, the entire copper oxide film was lost. The AFM image was measured, but the trench shape was not observed. In this etchant, it is not possible to selectively etch only one of a mixture of the copper oxides having different oxidation numbers.

Comparative Example 7

A film was formed under the same condition as that of Example 27, exposure was performed, and a mixture of the copper oxides having different valences was etched using the etchant adjusted under the same condition as that of Example 23.

The etching was performed by spraying the etchant to a mixture of the copper oxides having different valences using a line slit nozzle for 0.5 minutes at a temperature of 23° C. with a discharge pressure of 0.3 MPa. Then, the AFM image of the etched copper oxide was measured. As a result, while a periodic trench shape having a trench depth of 2.6 nm was observed in a certain place, no trench shape was found in other places, so that the etching selectivity or homogeneity was degraded resultantly.

INDUSTRIAL APPLICABILITY

Using the copper oxide etchant disclosed herein, it is possible to selectively etch exposure/non-exposure portions when the copper oxide is used as a thermal-reactive resist, and exposure is performed using laser light. Therefore, the copper oxide etchant disclosed herein is effective to manufacture a fine pattern, and may be applied in various fields such as an optical material.

This application claims a priority of Japanese Patent Application Nos. 2010-39693 and 2010-40122, filed Feb. 25, 2010, Japanese Patent Application No. 2010-154855, filed Jul. 7, 2010, and Japanese Patent Application No. 2010-282267, filed Dec. 17, 2010, which are herein incorporated by reference.

The invention claimed is:

1. A method of etching a copper oxide-containing layer containing copper oxide (II) in an amount of 50 mass % or higher, comprising the steps of:
    thermally decomposing the copper oxide (II) to copper oxide (I) in a predetermined area of the copper oxide-containing layer so that the copper oxide (I) is present in the predetermined area; and
    selectively dissolving the copper oxide (I) in the predetermined area with an etchant containing at least a chelating agent.

2. The method according to claim 1, wherein the thermal decomposing is performed by exposure.

3. The method according to claim 2, wherein the exposure is laser exposure.

4. The method according to claim 1, wherein the chelating agent comprises;
    at least one amino acid selected from the group consisting of alanine, arginine, asparagine, aspartic acid, cysteine, glutamine, glutamic acid, glycine, histidine, isoleucine, leucine, lysine, methionine, ornithine, phenylalanine, serine, threonine, tryptophan, tyrosine, valine, and proline,
    and/or
    at least one acid selected from the group consisting of oxalic acid, ethylenediaminetetraacetic acid, hydroxyethylethylenediaminetriacetic acid, dihydroxyethylethylenediaminediacetic acid, 1,3-propanediaminetetraacetic acid, citric acid, fumaric acid, adipic acid, succinic acid, malic acid, tartaric acid, and bathocuproinesulfonic acid or at least one salt thereof.

5. The method according to claim 4, wherein the chelating agent contains at least one amino acid.

6. The method according to claim 4, wherein the chelating agent contains at least one selected from the group consisting of glycine, alanine, ornithine, and lysine.

7. The method according to claim 1, wherein a ratio of the chelating agent in the etchant is equal to or greater than 0.00001 mass % and equal to or smaller than 10 mass %.

* * * * *